US009470503B2

(12) United States Patent
Gerson

(10) Patent No.: US 9,470,503 B2
(45) Date of Patent: Oct. 18, 2016

(54) STRAIN-BASED SENSING OF MIRROR POSITION

(71) Applicant: APPLE INC., Cupertino, CA (US)

(72) Inventor: Yuval Gerson, Tel-Mond (IL)

(73) Assignee: APPLE INC., Cupertino, CA (US)

(*) Notice: Subject to any disclaimer, the term of this patent is extended or adjusted under 35 U.S.C. 154(b) by 116 days.

(21) Appl. No.: 14/552,500

(22) Filed: Nov. 25, 2014

(65) Prior Publication Data

US 2015/0241196 A1    Aug. 27, 2015

Related U.S. Application Data

(60) Provisional application No. 61/944,582, filed on Feb. 26, 2014.

(51) Int. Cl.
| | | |
|---|---|---|
| G01L 1/00 | (2006.01) |
| G01B 7/00 | (2006.01) |
| G02B 26/10 | (2006.01) |
| G02B 26/08 | (2006.01) |
| G01B 7/16 | (2006.01) |
| G01L 1/18 | (2006.01) |
| G01L 25/00 | (2006.01) |
| B81B 3/00 | (2006.01) |

(52) U.S. Cl.
CPC .............. *G01B 7/003* (2013.01); *B81B 3/00* (2013.01); *G01B 7/18* (2013.01); *G01L 1/18* (2013.01); *G01L 25/00* (2013.01); *G02B 26/0833* (2013.01); *G02B 26/105* (2013.01)

(58) Field of Classification Search
None
See application file for complete search history.

(56) References Cited

U.S. PATENT DOCUMENTS

| | | | |
|---|---|---|---|
| 7,952,781 B2 | 5/2011 | Weiss et al. | |
| 2001/0048784 A1* | 12/2001 | Behin | B81B 3/0021 385/18 |
| 2005/0078169 A1 | 4/2005 | Tumer | |
| 2006/0125597 A1 | 6/2006 | Kamiya et al. | |

(Continued)

FOREIGN PATENT DOCUMENTS

| | | |
|---|---|---|
| DE | 19709913 A1 | 10/1998 |
| EP | 2851733 A2 | 3/2015 |
| JP | 2011020207 A | 2/2011 |
| JP | 2011215324 A | 10/2011 |
| JP | 2012237788 A | 12/2012 |
| WO | 2014016794 A1 | 1/2014 |

OTHER PUBLICATIONS

International Application # PCT/US2015/014341 Search Report dated Apr. 23, 2015.

(Continued)

*Primary Examiner* — Andre Allen
(74) *Attorney, Agent, or Firm* — D. Kligler I.P. Services Ltd.

(57) ABSTRACT

Mechanical apparatus includes a base, a moving element, and a hinge, having a first end attached to the moving element. A supporting structure is attached to the base and to the second end of the hinge and has at least a component perpendicular to the hinge so as to translate rotation of the moving element about the hinge into elongation of the component, whereby the moving element rotates about the hinge relative to the base while the supporting structure is deformed as a result of the rotation of the moving element about the hinge. A strain-based rotation sensor is associated with the supporting structure and is configured to provide a signal indicative of the rotation of the moving element responsively to a strain induced due to deformation of the supporting structure as the result of the rotation of the moving element.

16 Claims, 6 Drawing Sheets

(56) References Cited

U.S. PATENT DOCUMENTS

| | | | |
|---|---|---|---|
| 2009/0059344 A1* | 3/2009 | Marxer | G02B 26/0841 359/290 |
| 2010/0195180 A1 | 8/2010 | Akanuma et al. | |
| 2011/0199284 A1 | 8/2011 | Davis et al. | |
| 2013/0163061 A1* | 6/2013 | Kanno | G02B 26/0841 359/224.1 |
| 2014/0062506 A1* | 3/2014 | Defazio | G02B 26/0841 324/658 |
| 2014/0313558 A1* | 10/2014 | Davis | G02B 26/0833 359/200.8 |
| 2015/0103321 A1* | 4/2015 | Reiss | G02B 26/0833 353/31 |

OTHER PUBLICATIONS

Liu, C., "Foundations of MEMS", Prentice Hall, Second Edition, Chapter 6, pp. 231-268, year 2012.

Clausen et al., "Design and processing of a cost-effective piezoresistive MEMS cantilever sensor for medical and biomedical use", Journal of Micromechanics and Microengingeering, vol. 22, pp. 1-6, Jun. 22, 2012.

Bao et al., "Geometrical Rules of Four-Terminal Gauge for Pressure Sensors", Sensors and Actuators 18, pp. 149-156, year 1989.

* cited by examiner

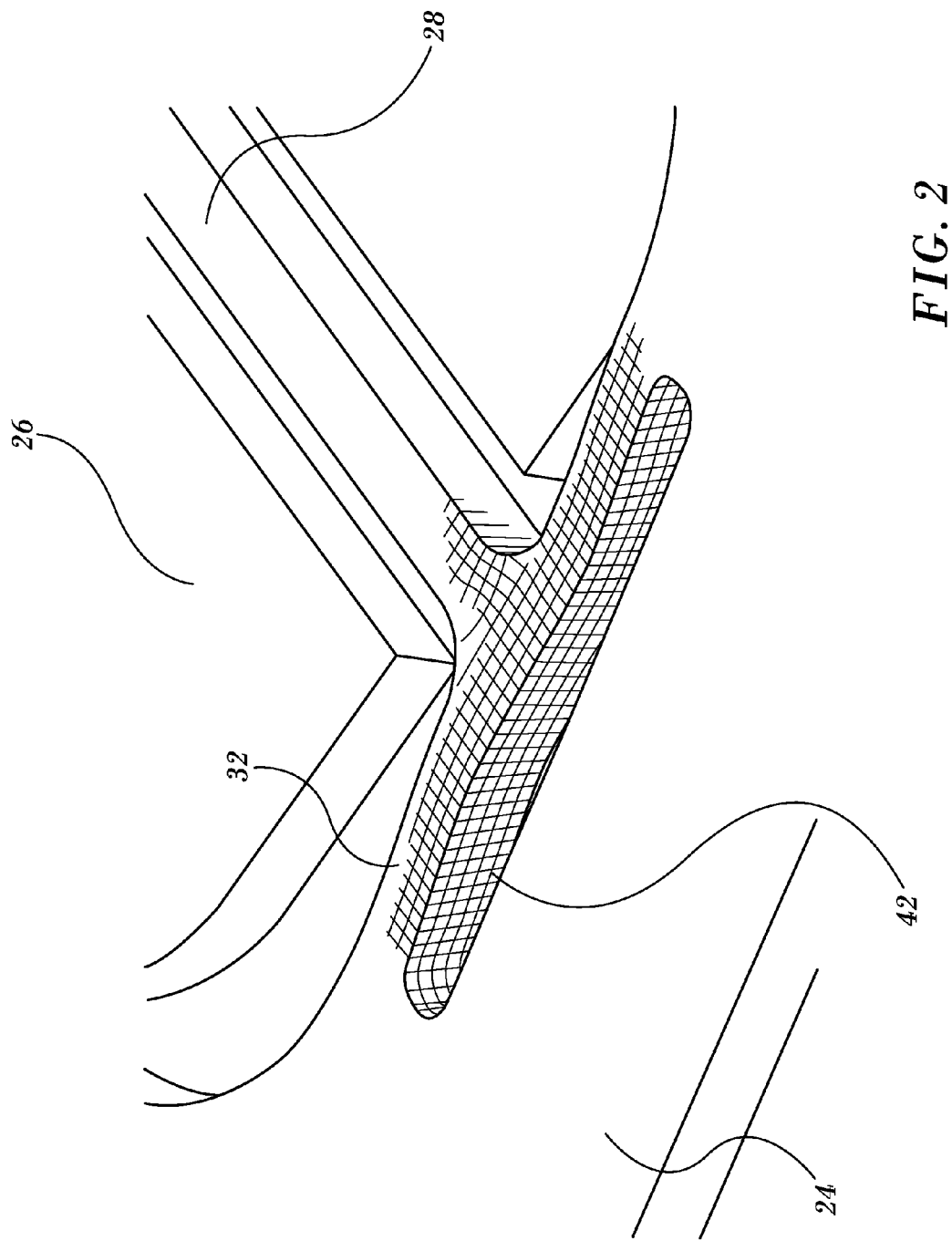

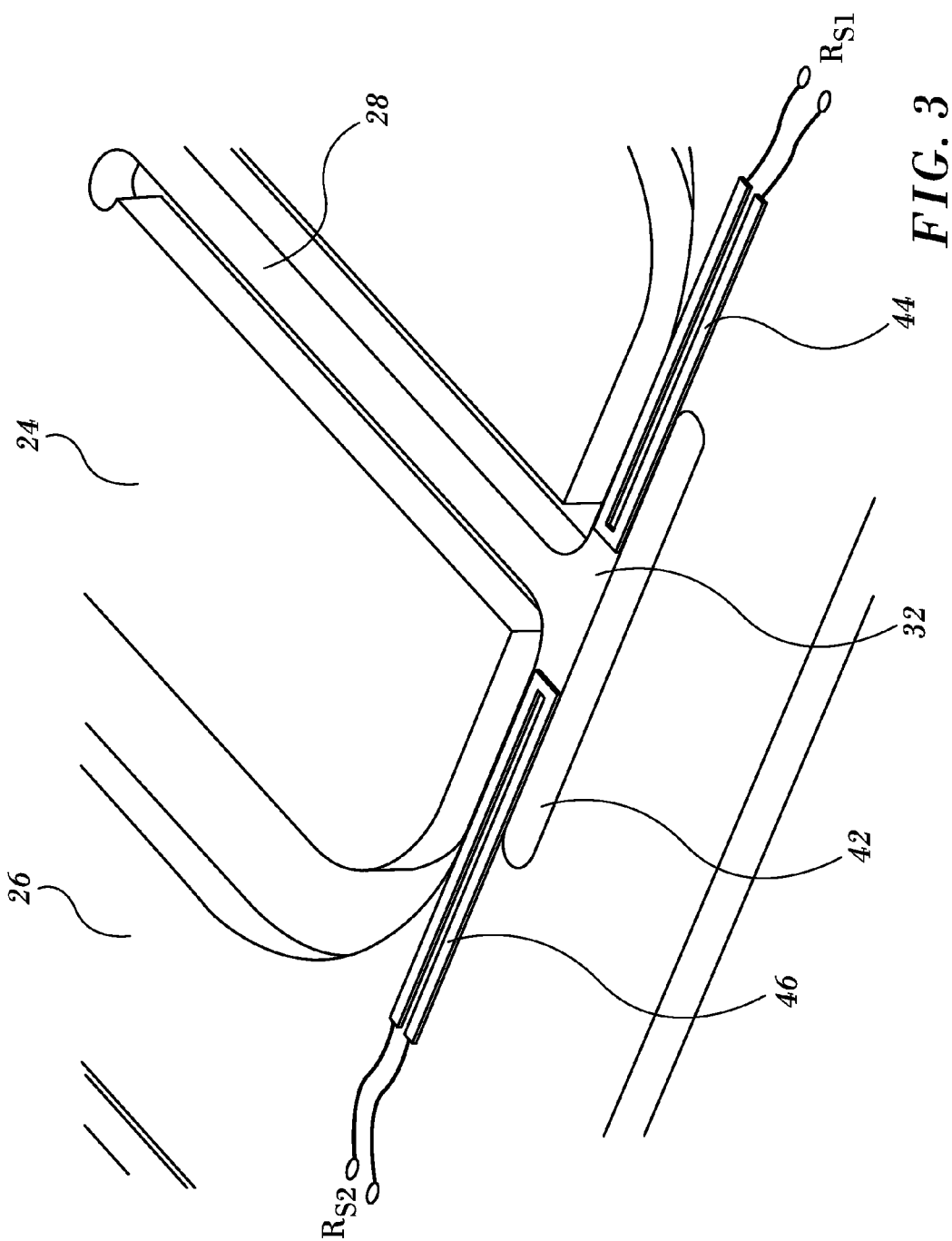

STRAIN-BASED SENSING OF MIRROR POSITION

CROSS-REFERENCE TO RELATED APPLICATION

This application claims the benefit of U.S. Provisional Patent Application 61/944,582, filed Feb. 26, 2014, which is incorporated herein by reference.

FIELD OF THE INVENTION

The present invention relates to monitoring the motion of rotating mechanical devices, and particularly of scanning micromirrors.

BACKGROUND

PCT International Publication WO 2014/016794, whose disclosure is incorporated herein by reference, describes scanning micromirrors based on microelectromechanical systems (MEMS). Embodiments described in this application provide scanning mirror assemblies that include a support structure; a base (also referred to as a gimbal), which is mounted to rotate about a first axis relative to the support structure; and a mirror, which is mounted to rotate about a second axis relative to the base.

In one of the embodiments described in this PCT application, capacitive sensing is used to monitor the rotation of the mirror, using plates of a capacitive sensor that are positioned in proximity to the mirror on opposite sides of the axis of rotation. (In the disclosed embodiment, the plates are angled relative to the plane of the support structure, although in other implementations, the plates may be parallel to the plane of the support structure.) Changes in the capacitance between the plates and the mirror are measured so as to monitor rotation of the mirror.

Strain-based sensors (typically piezoresistive or metallic) are commonly used for measuring deflection of membranes, sensing pressure, measuring deflection of cantilever beams in accelerometers and gyros, and other applications. Various types of strain sensors are known in the art. For example, in a metallic strain sensor, the resistance of a metal resistor changes due to shape deformation that can occur in response to strain. Doped silicon exhibits a strong piezoresistive response, meaning that its resistance changes markedly as a function of the strain itself, which can result from various modes of applied stress. Resistive strain sensing and its use in MEMS are described, for example by Liu in *Foundations of MEMS* (Illinois ECE Series, Northwestern University, 2005), Chapter 6, which is incorporated herein by reference.

SUMMARY

Embodiments of the present invention that are described herein use strain-based sensing in measuring rotation, and in particular in measuring the angle of deflection of a MEMS assembly.

There is therefore provided, in accordance with an embodiment of the present invention, mechanical apparatus, which includes a base, a moving element, and a hinge, having a first end attached to the moving element and having a second end. A supporting structure is attached to the base and to the second end of the hinge is attached and has at least a component perpendicular to the hinge so as to translate rotation of the moving element about the hinge into elongation of the component, whereby the moving element rotates about the hinge relative to the base while the supporting structure is deformed as a result of the rotation of the moving element about the hinge. A strain-based rotation sensor is associated with the supporting structure and is configured to provide a signal indicative of the rotation of the moving element responsively to a strain induced due to deformation of the supporting structure as the result of the rotation of the moving element.

In the disclosed embodiments, the component of the supporting structure that is perpendicular to the hinge includes a beam, having ends that are attached to the base. Additionally or alternatively, at least the base, supporting structure, moving element and hinge are formed from a semiconductor wafer in a MEMS process, and the strain-based rotation sensor is formed on the semiconductor wafer as a part of the MEMS process. The strain-based rotation sensor may include a piezoresistive sensor, which is formed by doping the semiconductor material in the supporting structure, and/or a metallic strain sensor, including a metal trace deposited on the supporting structure.

In one embodiment, the moving element includes a scanning mirror, and the base includes a gimbal.

In the disclosed embodiments, the rotation sensor has a resistance that varies responsively to the strain in the supporting structure, and the apparatus includes a sensing circuit, which is coupled to output an indication of an angle of the rotation of the moving element responsively to the varying resistance. In one embodiment, the sensing circuit includes a resistor bridge. The rotation sensor may include a cruciform strain sensor having two pairs of mutually-perpendicular arms, wherein the sensing circuit is coupled to respective ends of the arms in order to sense the angle of the rotation.

Typically, the hinge is one of a pair of hinges, attached to opposite sides of the moving element, and the strain-based rotation sensor is one of a pair of rotation sensors that are associated with supporting structures to which the hinges are attached on the opposite sides of the moving element.

There is also provided, in accordance with an embodiment of the present invention, a method for sensing, which includes mounting a moving element to rotate on a hinge relative to a base, such that a first end of the hinge is attached to the moving element. A second end of the hinge is attached to a supporting structure attached to the base, the supporting structure having at least a component perpendicular to the hinge so as to translate rotation of the moving element about the hinge into elongation of the component, whereby the moving element rotates about the hinge relative to the base while the supporting structure is deformed as a result of the rotation of the moving element about the hinge. The rotation of the moving element is measured by sensing a strain in the supporting structure induced due to deformation of the supporting structure as the result of the rotation of the moving element.

The present invention will be more fully understood from the following detailed description of the embodiments thereof, taken together with the drawings in which:

BRIEF DESCRIPTION OF THE DRAWINGS

FIG. 2 is a schematic detail view of a gimbaled scanning mirror showing deformation resulting from rotation of the mirror, in accordance with an embodiment of the present invention;

FIG. 3 is a schematic detail view of a gimbaled scanning mirror with integral strain-based rotation sensors, in accordance with an alternative embodiment of the present invention;

DETAILED DESCRIPTION OF EMBODIMENTS

Measurement of angular deflection in MEMS devices is in general difficult to accomplish using strain-based methods. One reason for this difficulty is that the elongation and shortening of the mechanical components of a MEMS assembly are relatively small in torsion, and therefore the associated strains are small, as well.

Embodiments of the present invention that are described hereinbelow solve this problem by translating rotational movement of a MEMS assembly into bending of certain parts of the assembly. The stretching and compression that are associated with this bending induce larger strains, which can be detected using piezoresistive, piezoelectric or metallic strain sensors. Such sensors can be produced as an integral part of the MEMS fabrication process, by appropriate silicon doping and/or metal coating, or any other suitable method, and can thus be integrated in MEMS assemblies compactly and efficiently at little added cost.

Figure 1:
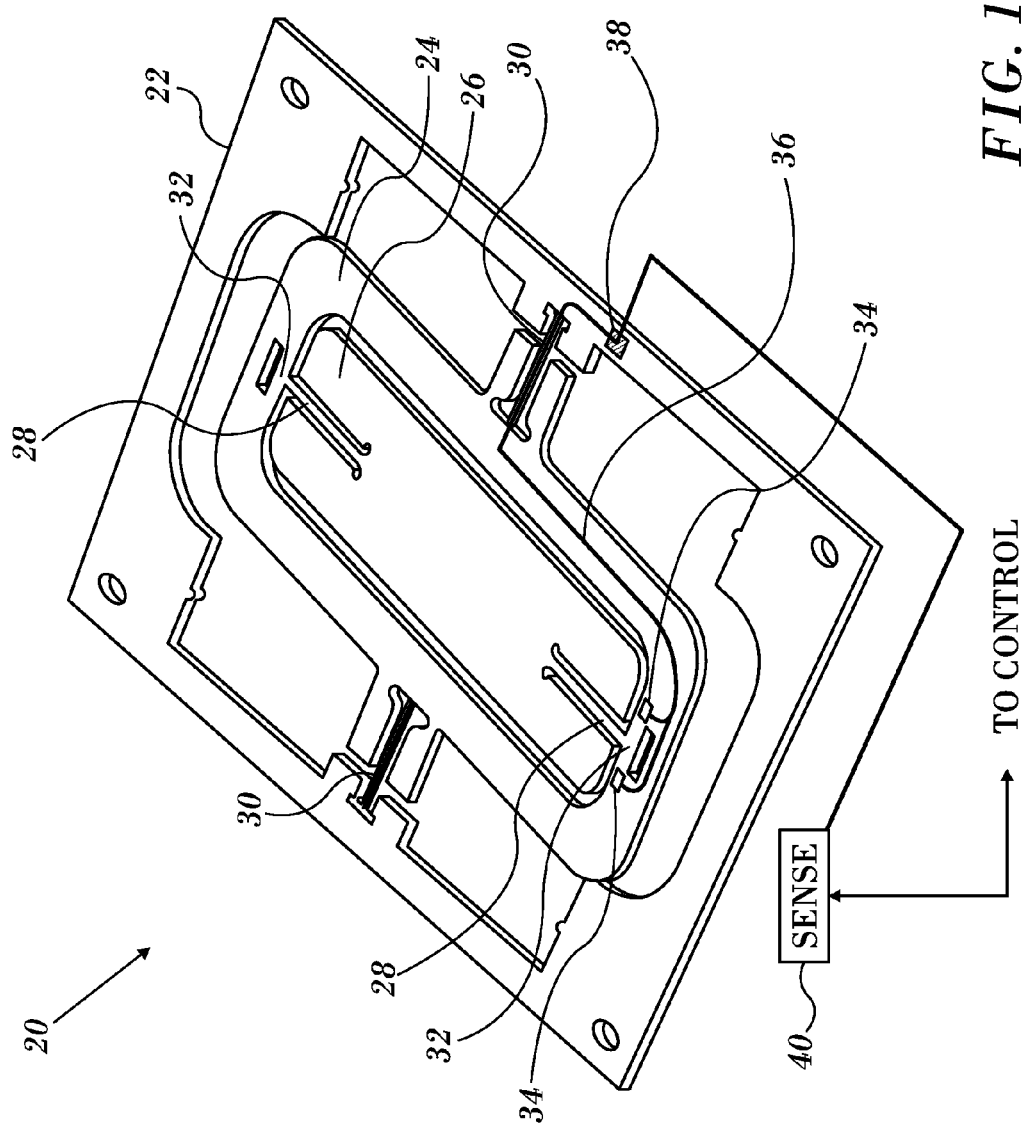
FIG. 1 is a schematic, pictorial illustration of a scanning mirror assembly, in accordance with an embodiment of the present invention.

FIG. 1 is a schematic, pictorial illustration of a scanning mirror assembly 20, in accordance with an embodiment of the present invention. Assembly 20 is typically produced using a MEMS process to define and release the moving elements of the assembly by appropriate etching of a silicon wafer substrate, as well as to deposit electrical elements of the assembly that are used, inter alia, in sensing rotation. Scanning of assembly 20 may be driven by a magnetic drive, as described in the above-mentioned PCT International Publication WO 2014/016794, for example, or by any other suitable type of miniature drive that is known in the art. Further details of MEMS processes and components that can be used in the design and production of assembly are described in this PCT publication and in U.S. Pat. No. 7,952,781, whose disclosure is incorporated herein by reference.

Assembly 20 comprises a frame 22, which is etched to define a rotating gimbal 24 and a mirror 26. In the pictured embodiment, mirror 26 rotates about torsion hinges 28 relative to gimbal 24, while gimbal 24 rotates relative to frame 22 on torsion hinges 30, which are perpendicular to hinges 28. The borders of the mirror, gimbal and hinges are defined by a photolithographic mask, and the wafer is then etched to release the moving mirror, gimbal and hinges from the surrounding parts of the wafer. In a typical MEMS device, the transverse dimensions of hinges 28 and 30 may be on the order of 20-200 µm.

In the disclosed embodiments, gimbal 24 thus serves as the base for movement of mirror 26, while frame 22 serves as the base for movement of gimbal 24, and together these elements enable two-dimensional scanning of the mirror angle. The principles of the present invention, however, are generally applicable to each hinge and axis of rotation separately, and thus may be applied, as well, in assemblies having only a single axis of rotation. For the sake of simplicity, the description that follows will relate only to hinges 28, although similar design and measurement techniques may likewise be applied to hinges 30, as well as to rotating structures of other sorts in MEMS assemblies.

Hinges 28 are attached at their inner ends to mirror and at their outer ends to supporting structures, comprising beams 32, that are attached to gimbal 24. These supporting structures are shown in greater detail in the figures that follow. Beams 32 are perpendicular to hinges 28 and are attached in such a way as to translate rotation of mirror 26 about the hinges into elongation of the beams. Thus, as mirror 26 rotates about hinges 28 relative to gimbal 24, the supporting structures, and particularly beams 32, are deformed, giving rise to strain in the supporting structure.

One or more strain-based rotation sensors 34 are associated with each beam 32 (although for simplicity, the sensors shown in FIG. 1 are associated with only one of the beams). Sensors 34 provide signals indicative of the rotation of mirror 26 in response to the strain induced in beam 32 due to its deformation as mirror 26 rotates on hinges 28. Sensors 34 may comprise piezoresistive sensors, which may be formed by doping the semiconductor material in beam 32 and/or other parts of the supporting structure. Additionally or alternatively, sensors 34 may comprise metallic strain sensors, comprising a metal trace deposited on the supporting structure. In either case, the doping and/or trace deposition required to create sensors 34 may be performed as a part of the MEMS fabrication process by which scanning mirror assembly 20 is produced.

Sensors 34 are connected by traces 36 formed on the substrate of assembly 20, typically by metal deposition during the MEMS fabrication process, to connection pads 38, which are in turn connected to a sensing circuit 40. As a step in the MEMS process, a reflective metal coating is typically deposited on the surface of mirror 26; and in this same step, or in another metal deposition step, pads 38 and traces 36 may be deposited on the wafer surface. Sensing circuit 40 typically detects the level of the strain in beams 32 by measuring the resistance across sensors 34. This level of strain is indicative of the angle of rotation of mirror 26: The greater the angle of rotation, the greater will be the torsion in hinges 28, and thus the greater the strain in beam 32. Sensing circuit 40 may then apply a predefined calibration function in order to convert the detected level of strain into a reading of rotation angle.

FIG. 2 schematically shows a detail of scanning mirror assembly 20 with an integral piezoresistive rotation sensor, in accordance with an embodiment of the present invention. To produce the piezoresistive sensor, an additional recess 42 is etched through gimbal 24 adjacent to the end of hinge 28, thereby defining beam 32, which is attached to gimbal 24 perpendicular to the hinge. The outer end of hinge 28 is attached to the middle of beam 32, whose transverse dimensions are similar to those of the hinge (on the order of 20-200 µm wide). Beam 32 thus translates rotation of mirror 26 about hinge 28 into elongation of the beam.

Alternatively, other sorts of supporting structures with such a perpendicular component can be used to similar effect and are considered to be within the scope of the present invention. Furthermore, the form and transverse dimensions of the beam or other supporting structure can be optimized to provide the desired, measurable strain as function of angle.

In the present embodiment, beam 32 is doped with a suitable dopant, as described, for example, in the Liu reference mentioned above. To measure changes in the resistance of the doped silicon due to rotation of the hinge, electrodes, for example metal pads (not shown in this figure), are deposited at appropriate points on or adjacent to the ends of the beam, such as at the locations of sensors 34 shown in FIG. 1. Sensing circuit 40 measures the resistance between the pads in order to detect the strain in beam 32.

The gridlines in FIG. 2 illustrate the effect of rotation of mirror 26 on hinge 28 and beam 32. Rotation of the mirror causes some torsion in the hinge, but with little attendant deformation, and hence little strain in the hinge. On the other hand, rotational forces at the end of the hinge cause the beam to bend substantially. This bending induces a longitudinal stress in the beam, leading to a strain in the doped silicon that increases as a function of the rotation angle of the mirror.

The changing strain in beam 32 gives rise to a piezoresistive change in the resistance between the measurement points on the beam. As noted earlier, this varying resistance can be calibrated as a function of rotation angle, and measurement of the variation of the resistance between the measurement points thus gives an accurate indication of the angle. The beam form, thickness and length, the choice and concentration of dopants, and the locations of the measurement points may be selected, based on first principles and/or empirical measurements, to give the desired range of resistance variation. During operation of the mirror assembly, measurement of the resistance across the beam may be used for closed-loop control and monitoring of the scan angle of the assembly.

FIG. 3 schematically shows a detail of scanning mirror assembly 20 with integral strain-based rotation sensors 44 and 46, in accordance with an alternative embodiment of the present invention. In this example, sensors 44 and 46 comprise strain gauges made from metal traces, which are deposited along the beam. A "pi-shaped" pattern is shown in FIG. 3 by way of example, but other sorts of patterns may alternatively be used, such as serpentine, cruciform, or H-shaped patterns. Doped strain-sensing patterns can be made in similar shapes.

Bending of beam 32 due to rotation of mirror 26 about hinges 28 (as shown in FIG. 2) causes deformation of the metal traces of strain sensors 44 and 46, which in turn causes the resistance, $R_{S1}$ and $R_{S2}$, along each of the traces to change. Variations in the resistance between the ends of each trace as a function of the mirror rotation angle are measured and calibrated, as in the preceding embodiment, in order to sense the deflection angle of the mirror.

Figure 4:
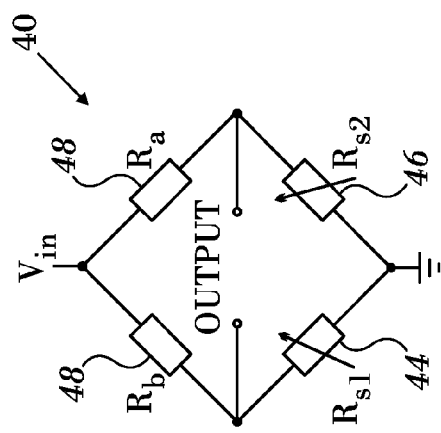
FIG. 4 is a schematic electrical diagram of a strain sensing circuit, in accordance with an embodiment of the present invention.

FIG. 4 is a schematic electrical diagram of strain sensing circuit 40, in accordance with an embodiment of the present invention. Circuit 40 comprises a resistor bridge, with a pair of fixed resistors 48, labeled $R_a$ and $R_b$, which is used to measure changes in the resistance across strain sensors 44 and 46, located on opposite sides of beam 32 as shown in FIG. 3. A known input voltage, which may be an AC or DC voltage, or a combination of AC and DC components, is applied across the bridge, and variations in the output voltage indicate changes in the resistance of sensors 44 and 46.

Figure 5:
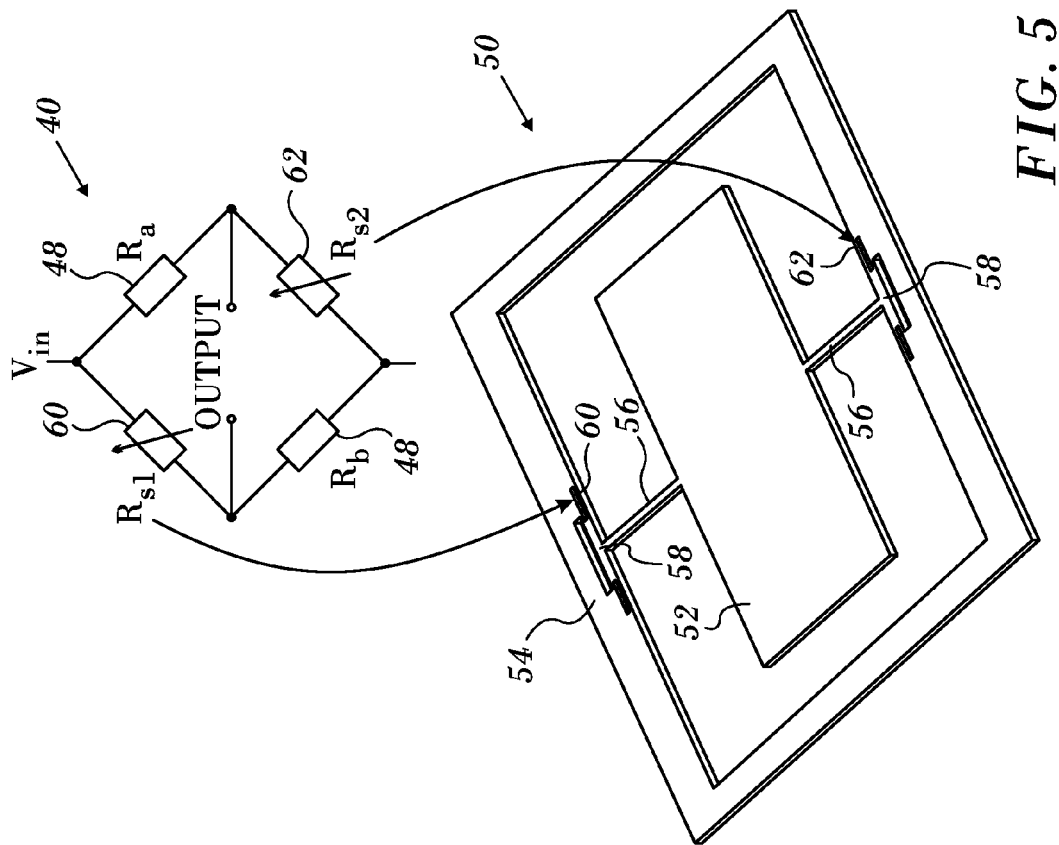
FIG. 5 is a schematic pictorial illustration of a scanning mirror assembly with a strain sensing circuit, in accordance with another embodiment of the present invention.

FIG. 5 is a schematic pictorial illustration of a scanning mirror assembly 50 with strain sensing circuit 40, in accordance with another embodiment of the present invention. Assembly 50 comprises a mirror 52, which rotates relative to a base 54 on hinges 56 that are attached to beams 58, as in the preceding embodiment. In this case, however, the resistor bridge in sensing circuit 40 measures changes in the resistance across a pair of strain sensors 60 and 62 on beams 58 that are attached to hinges 56 on opposite sides of the mirror. In this case, as well, strain-induced changes in resistance of the sensors will lead to changes in the output voltage of the bridge.

Figure 6A:
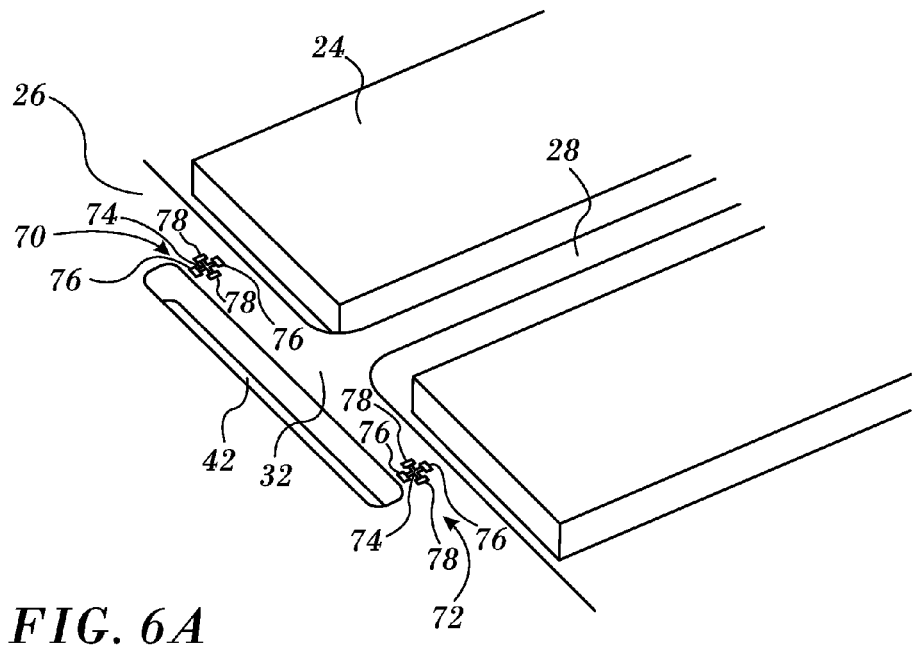
FIG. 6A is a schematic detail view of a gimbaled scanning mirror with integral strain-based rotation sensors, in accordance with another embodiment of the present invention.

FIG. 6A schematically shows a detail of scanning mirror assembly 20 with integral strain-based rotation sensors 70 and 72, in accordance with another embodiment of the present invention. Sensors 70 and 72 are configured as four-terminal strain gauges, using the piezoresistive response of doped silicon. Each of sensors 70 and 72 comprises a cruciform doped region 74 of beam 32, which may be produced by injecting boron ions into the silicon substrate, for example. Two sets of electrodes 76 and 78, comprising copper pads, for example, contact the opposing ends of the arms of region 74 along mutually perpendicular axes. One axis, between electrodes 78, is parallel to beam 32, while the other axis, between electrodes 76, is perpendicular to the beam.

As hinge 28 rotates toward one end of its travel, and beam 32 is deformed (as illustrated in FIG. 2), the upper surface of one end of the beam will stretch longitudinally, while the upper surface of the other end of the beam is compressed. The stretching and compression are reversed at the other end of the travel of the mirror. Stretching of the upper surface of one end of beam 32 also stretches the arms of region 74 between electrodes 78 at that end of the beam, thus increasing the resistance between these electrodes. At the same time, the resistance between electrodes 76 will decrease as the arms of region 74 between electrodes 76 are compressed due to the Poisson effect. Compression of the upper surface at the other end of beam 32 will have the opposite effect on the resistances measured between the electrodes at that end of the beam.

Figure 6B:
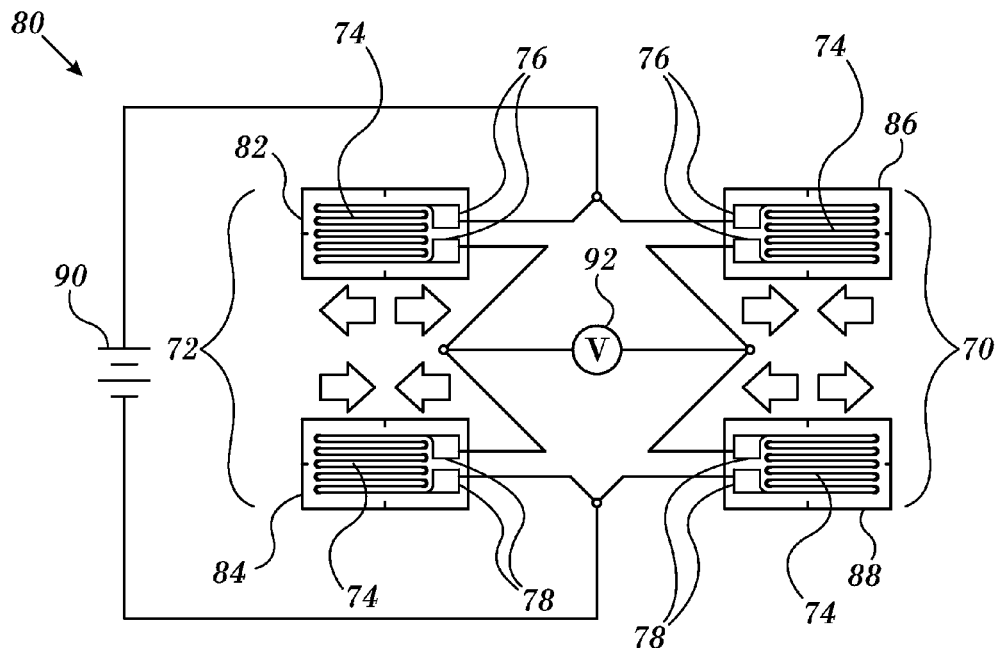
FIG. 6B is a schematic electrical diagram of a strain sensing circuit for use with the embodiment of FIG. 6A.

FIG. 6B is a schematic electrical diagram of a strain sensing circuit 80 for use with sensors 70 and 72, in accordance with an embodiment of the present invention. Circuit 80 is configured as a full bridge, comprising variable resistors 82 and 84 formed by the perpendicular arms of doped region 74 in sensor 72, and variable resistors 86 and 88 formed by the perpendicular arms of doped region 74 in sensor 70. Further details of full-bridge arrangements of piezoresistive sensors are described, for example, by Clausen et al., in "Design and processing of a cost-effective piezoresistive MEMS cantilever sensor for medical and biomedical use," *Journal of Micromechanics and Microengingeering* 22 (2012), pages 1-6.

As shown in FIG. 6B, a voltage supply 90 (which may be DC, AC or a combination of both) applies a known voltage between the inputs to circuit 80, and a voltage sensor 92 measures variations in the output signal from the circuit due to changes in the resistances of variable resistors 82, 84, 86 and 88. As illustrated by the arrows in the figure, rotation of hinge 28 will cause the resistances of resistors 82 and 88 to increase in concert, while the resistances of resistors 84 and 86 decrease, and vice versa. Sensor 92 measures the resulting modulation of the output voltage in order to extract the angular amplitude and frequency of rotation of mirror 26.

Figure 7A:
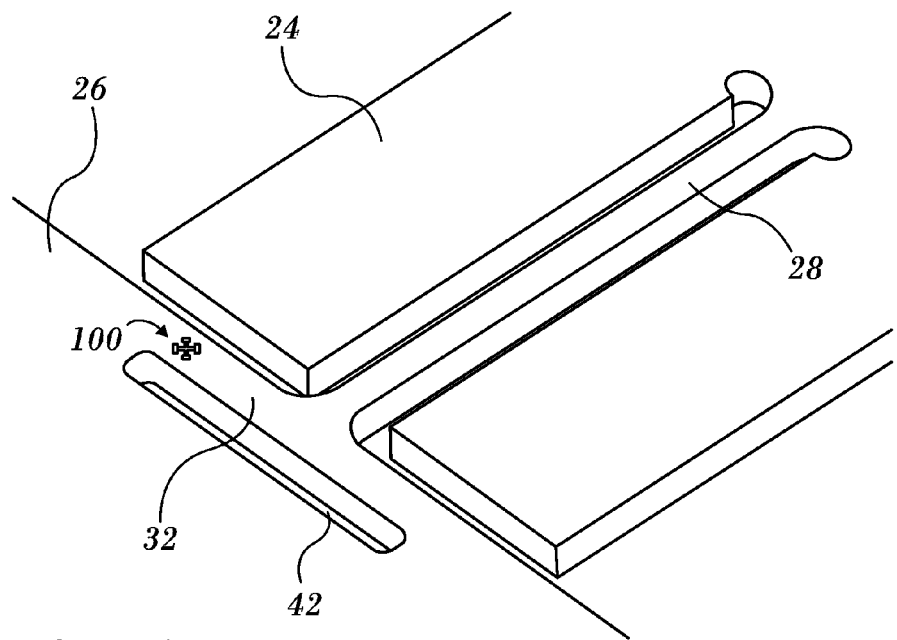
FIG. 7A is a schematic detail view of a gimbaled scanning mirror with an integral strain-based rotation sensor, in accordance with yet another embodiment of the present invention.

FIG. 7A is a schematic detail view of a gimbaled scanning mirror with an integral strain-based rotation sensor 100, in accordance with yet another embodiment of the present invention. Sensor 100 is again cruciform, as in the preceding embodiment, and may be produced by appropriately doping the silicon substrate. In this case, however, the arms of sensor 100 are oriented diagonally relative to beam 32 and use different principles of measurement. These principles are explained in detail, for example, by Bao et al., in "Geometrical Rules of Four-Terminal Gauge for Pressure Sensors," *Sensors and Actuators* 18 (1989) pages 149-156.

Figure 7B:
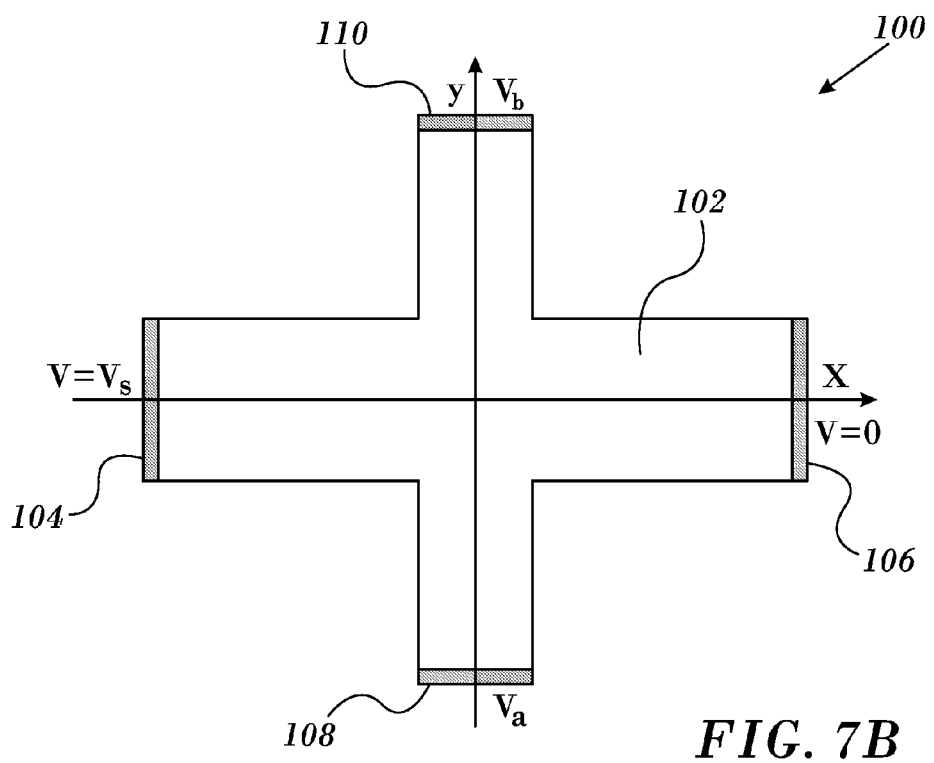
FIG. 7B is an enlarged view of the sensor of FIG. 7A.

FIG. 7B is an enlarged view of sensor 100, in accordance with an embodiment of the present invention. Sensor 100 comprises a cruciform doped region 102, with two pairs of arms that may be of different widths. Electrodes 104 and 106 are coupled to respective ends of the wider pair of arms of region 102, while electrodes 108 and 110 are coupled to the ends of the narrow pair. A known voltage Vs is applied between electrodes 104 and 106, and the resulting leakage voltage signal ($V_a$-$V_b$) is measured between electrodes 108 and 110. As in the preceding embodiment, this leakage voltage output will vary in synchronization with the rotation of mirror 26, with an amplitude indicative of the angular amplitude of rotation of the mirror.

Although the figures illustrate the use of strain-based sensing techniques only in measuring the angle of rotation of a mirror relative to a gimbal, similar techniques may be applied in measuring the angle of rotation of the gimbal relative to its frame, as well as in measurement of angular deflection of other sorts of rotating elements in MEMS assemblies of other types, not limited in any way to scanning mirrors. Furthermore, although for the sake of clarity and concreteness, two specific types of sensor configurations are shown in the figures and described above, the principles of the present invention may similarly be applied in producing strain-based deflection sensors of other shapes and configurations, in accordance with different application requirements. Such sensors may use not only piezoresistive and metallic strain sensing, but also other types of strain sensing, such as piezoelectric sensing.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Mechanical apparatus, comprising:
a base;
a moving element;
a hinge, having a first end attached to the moving element and having a second end;
a beam, which is perpendicular to the hinge and has ends that are attached to the base,
wherein the second end of the hinge is attached to the beam at a location between the ends so that the beam elongates in response to rotation of the moving element about the hinge, whereby the moving element rotates about the hinge relative to the base while the beam is deformed as a result of the rotation of the moving element about the hinge;
a strain-based rotation sensor, which comprises at least one cruciform doped region within the beam, the doped region comprising two pairs of mutually-perpendicular arms having respective resistances that vary responsively to a strain induced due to deformation of the beam as the result of the rotation of the moving element; and
a sensing circuit, which is coupled to respective ends of the arms and is configured to output an indication of an angle of the rotation of the moving element responsively to the varying resistances.

2. The apparatus according to claim 1, wherein at least the base, beam, moving element and hinge are formed from a semiconductor wafer comprising a semiconductor material in a MEMS process, and the strain-based rotation sensor is formed on the semiconductor wafer as a part of the MEMS process.

3. The apparatus according to claim 1, wherein the moving element comprises a scanning mirror, and the base comprises a gimbal.

4. The apparatus according to claim 1, wherein the sensing circuit comprises a resistor bridge.

5. The apparatus according to claim 1, wherein the hinge is one of a pair of hinges, attached to opposite sides of the moving element, and the strain-based rotation sensor is one of a pair of rotation sensors that are associated with supporting structures to which the hinges are attached on the opposite sides of the moving element.

6. A method for sensing, comprising:
mounting a moving element to rotate on a hinge relative to a base, such that a first end of the hinge is attached to the moving element;
attaching a second end of the hinge to a beam, which is perpendicular to the hinge and has ends attached to the base,
wherein the second end of the hinge is attached to the beam at a location between the ends, so that the beam elongates in response to rotation of the moving element about the hinge, whereby the moving element rotates about the hinge relative to the base while the beam is deformed as a result of the rotation of the moving element about the hinge; and
measuring the rotation of the moving element by sensing a strain in the beam induced due to deformation of the beam as the result of the rotation of the moving element, using a strain-based rotation sensor, which comprises at least one cruciform doped region within the beam, the doped region comprising two pairs of mutually-perpendicular arms having respective resistances that vary responsively to the strain, wherein sensing the strain comprises measuring a signal between respective ends of the arms in order to sense an angle of the rotation.

7. The method according to claim 6, wherein at least the base, beam, moving element and hinge are formed from a semiconductor wafer comprising a semiconductor material in a MEMS process, and wherein sensing the strain comprises forming a strain-based rotation sensor on the semiconductor wafer as a part of the MEMS process.

8. The method according to claim 6, wherein the moving element comprises a scanning mirror, and the base comprises a gimbal.

9. The method according to claim 6, wherein measuring the signal comprises coupling the ends of the arms to a resistor bridge.

10. The method according to claim 6, wherein the hinge is one of a pair of hinges, attached to opposite sides of the moving element, and wherein sensing the strain comprises receiving signals from a pair of rotation sensors that are associated with supporting structures to which the hinges are attached on the opposite sides of the moving element.

11. The apparatus according to claim 1, wherein the at least one cruciform region comprises a pair of cruciform regions located at the ends of the beam.

12. The apparatus according to claim 1, wherein the arms of the cruciform regions are oriented diagonally relative to the beam.

13. The apparatus according to claim 12, wherein the sensing circuit is coupled to measure a leakage voltage signal between the pairs of the arms, which is indicative of the angle of the rotation.

14. The method according to claim 6, wherein the at least one cruciform region comprises a pair of cruciform regions located at the ends of the beam.

15. The method according to claim 6, wherein the arms of the cruciform regions are oriented diagonally relative to the beam.

16. The method according to claim 15, wherein measuring the signal comprises measuring a leakage voltage signal between the pairs of the arms, which is indicative of the angle of the rotation.

* * * * *